United States Patent [19]

Hinds et al.

[11] Patent Number: 5,629,628

[45] Date of Patent: May 13, 1997

[54] INSTRUMENT AND METHOD FOR TESTING LOCAL AREA NETWORK CABLES

[75] Inventors: Mark E. Hinds; Robert J. Lewandowski, both of Seattle; Thomas P. Locke, Woodinville; Tzafrir Sheffer, Seattle, all of Wash.

[73] Assignee: Fluke Corporation, Everett, Wash.

[21] Appl. No.: 652,767

[22] Filed: May 23, 1996

Related U.S. Application Data

[62] Division of Ser. No. 222,156, Apr. 4, 1994, Pat. No. 5,559,427.

[51] Int. Cl.$^6$ ............................................. G01R 27/04
[52] U.S. Cl. ........................... 324/628; 324/66; 324/539; 379/6
[58] Field of Search ............................ 324/628, 519, 324/539, 66; 379/6, 25, 26

[56] References Cited

U.S. PATENT DOCUMENTS

| | | | |
|---|---|---|---|
| 4,634,964 | 1/1987 | Chattler | 324/628 |
| 5,502,392 | 3/1996 | Arjavalingam et al. | 324/638 |
| 5,532,603 | 7/1996 | Bottman | 324/628 |
| 5,539,321 | 7/1996 | Sciacero et al. | 324/628 |
| 5,559,427 | 9/1996 | Hinds et al. | 324/539 |

*Primary Examiner*—Maura K. Regan
*Attorney, Agent, or Firm*—Douglas J. Barker

[57] ABSTRACT

An instrument and method for the troubleshooting and verification of copper-wire local area network (LAN) cable systems provides a series of resistance and capacitance measurements between all possible wire pairs using a pair of switch matrices and a software method for evaluating the measurements which are stored in a two-dimensional matrix. The stored measurements are evaluated against predetermined figures of merit and the decision pattern in matrix form is compared to that of a known good LAN cable system. Error messages responsive to mismatches are generated and presented to the operator via a user interface. Near-end cross talk (NEXT) isolation is evaluated using a mathematically calculated differential capacitance technique. Error messages are generated responsive to difference capacitance values larger than a figure of merit correlated to an acceptable level of NEXT isolation.

10 Claims, 14 Drawing Sheets

500

$$\begin{bmatrix} \bullet & R12 & R13 & R14 & R15 & R16 & R17 & R18 \\ R21 & \bullet & R23 & R24 & R25 & R26 & R27 & R28 \\ R31 & R32 & \bullet & R34 & R35 & R35 & R37 & R38 \\ R41 & R42 & R43 & \bullet & R45 & R46 & R47 & R48 \\ R51 & R52 & R53 & R54 & \bullet & R56 & R57 & R58 \\ R61 & R62 & R63 & R64 & R65 & \bullet & R67 & R68 \\ R71 & R72 & R73 & R74 & R75 & R76 & \bullet & R78 \\ R81 & R82 & R83 & R84 & R85 & R86 & R87 & \bullet \end{bmatrix}$$

● = meaningless value

FIG. 7

● = meaningless value
+ = forward bias diode
- = reverse bias diode
* = open circuit
0 = short circuit $$\underline{520}$$

$$\begin{bmatrix} \bullet & C12 & C13 & C14 & C15 & C16 & C17 & C18 \\ C21 & \bullet & C23 & C24 & C25 & C26 & C27 & C28 \\ C31 & C32 & \bullet & C34 & C35 & C35 & C37 & C38 \\ C41 & C42 & C43 & \bullet & C45 & C46 & C47 & C48 \\ C51 & C52 & C53 & C54 & \bullet & C56 & C57 & C58 \\ C61 & C62 & C63 & C64 & C65 & \bullet & C67 & C68 \\ C71 & C72 & C73 & C74 & C75 & C76 & \bullet & C78 \\ C81 & C82 & C83 & C84 & C85 & C86 & C87 & \bullet \end{bmatrix}$$

● = meaningless value

|       |         |         | C13-C23 | C14-C24 | C15-C25 | C16-C26 | C17-C27 | C18-C28 |
| ----- | ------- | ------- | ------- | ------- | ------- | ------- | ------- | ------- |
| Pair 1,2 | ● | | | | | | | |
| Pair 3,6 | C31-C61 | C32-C62 | | | | | C37-C67 | C38-C68 |
| Pair 4,5 | C41-C51 | C42-C52 | C43-C53 | | C35-C65 | | C47-C57 | C48-C58 |
| Pair 7,8 | C71-C81 | C72-C82 | C73-C83 | C74-C84 | C75-C85 | C76-C86 | | |

● = Meaningless Value

FIG. 11

INSTRUMENT AND METHOD FOR TESTING LOCAL AREA NETWORK CABLES

This is a divisional of the prior application Ser. No. 08/222,156 filed Apr. 4, 1994. The benefit of the filing dates of which are hereby claimed under U.S.C. 35§120, now U.S. Pat. No. 5559427.

BACKGROUND OF THE INVENTION

This invention relates generally to devices employed in the testing of local area network (LAN) cables and in particular to an instrument which tests the relevant parameters of a copper-conductor LAN cable by measuring the capacitance between all pairs of conductors and employing a software method operating on the stored measurement data.

Local area networks (LAN's) now connect a vast number of personal computers, workstations, printers, and file servers in the modem office. A LAN system is most commonly implemented by physically connecting all of these devices with copper-conductor twisted-pair LAN cables, the most common being an 8-wire cable which is configured in 4 twisted-wire pairs with each end of the cable terminated in an industry-standard connector. Some LAN cables include a flexible foil wrapper that acts as an electrostatic shield. In a typical installation, LAN cables may be muted through walls, floors, and ceilings of the building. LAN cable systems require constant maintenance, upgrades, and troubleshooting because LAN cables and connectors are subject to breakage, offices and equipment must be moved, and new equipment are added.

The tasks of installing, replacing, or re-routing cables typically fall on a professional cable installer or in-house network maintenance person. During the installation phase, each cable is muted through the building and a connector is attached to the each end of the new cable. Each wire in the cable must be connected to its proper respective electrical connection at both ends of the LAN cable in order for the LAN connection to function properly. A variety of LAN cables are used in the industry, including: unshielded twisted pair ("UTP"), shielded twisted pair ("STP"), and coaxial cables. LAN cable installation practices, cable performance specifications, and building wiring practices are governed by the Electronic Industries Association Commercial Building Telecommunications Wiring Standard ETAFfIA 568.

Such connections can be tested with an electrical resistance-measuring instrument commonly known as an ohmmeter which tests the direct current (d.c.) resistance through the electrical path between the ohmmeter's test leads. Using the ohmmeter to effectively test a LAN cable requires detailed knowledge of the proper connections. The end of the LAN cable system in which the test instrument is applied is the "near-end". The other end of the LAN cable thereby becomes the "far-end". With a known termination such as resistors at the far-end of the cable to provide a complete circuit, the "wire map" or set of connections can be discerned, along with short-circuit and open-circuit wiring errors. This manual technique of probing connections quickly becomes prohibitively inefficient and time-consuming. For a cable of N wires, a total of N!/(N–2)! measurements must be performed for a complete test between all pairs of the N wires, probing each respective pair with both negative and positive polarity.

Specialized LAN cable test instruments have been developed to diagnose the most commonly encountered cable problems. The instrument automatically performs a series of resistance measurements thereby relieving the operator of the burden of probing individual connections manually. The instrument performs continuity checks on the cable to ensure that all the connections exist as required by industry standard definitions and provides the operator with a visual indication of continuity and proper connection of each wire pair through the cable. Tests for open-circuit errors, short-circuit errors, and crossed pair errors are provided.

The least expensive LAN cable test instruments are essentially specialized ohmmeters equipped to test industry-standard terminations and wire maps according to EIA/TIA-568. Such instruments allow for direct connection to the LAN cable, along with a special terminating device ("cable identifier"), which is connected to the far end of the cable to facilitate a known return path for the d.c. test current provided by the instrument for each specified wire pair thorough resistors with pre-determined values and diodes with pre-determined polarities. Such instruments suffer from several marked disadvantages however. First, because the instrument is limited to d.c. measurements, the set of tests that the instrument can perform is limited, leaving many of the potential faults in a cable undetected. A critical parameter is the amount of coupling between wire pairs, commonly referred to as cross-talk. Each of the four wire pairs is twisted together within the cable and that respective pairing must be maintained in order to get proper isolation from the other pairs. A common wiring error is to cross a wire pair at one end of the cable while duplicating the error at the other end. While the connection appears proper according to the d.c. measurement, the wire pairs are no longer twisted separately but are now commingled, resulting in an unacceptable level of cross-talk between the two wire pairs.

The second disadvantage of cable mapping instruments is that a cable identifier must be connected to the far-end of the cable being tested to provide a known return path for the d.c. test current. When the far-end of the cable is hundreds of feet away, the process of testing the cable becomes cumbersome, often requiring two people, one at the near-end and one at the far-end, to perform the task of troubleshooting and verifying multiple cables, often long after the initial installation has been completed, resulting in costly re-work.

More sophisticated LAN cable test instruments are often equipped for evaluating cross-talk between wire pairs at the near-end of cable through standardized near-end cross talk (commonly referred to as "NEXT") measurements. NEXT is a measure of the level of isolation between separate wire pairs. A NEXT test is typically performed by injecting a high frequency alternating current (a.c.) test signal into a wire pair at the near-end of the cable, often at frequencies similar to actual data rates which range as high as 16 MHz, measuring the signal level induced in each of the other pairs as measured at the near-end, and comparing the induced signal level with the injected signal level to determine the level of isolation. A higher level of isolation between wire pairs is necessary to avoid interference between data communication paths. The consequence of inadequate isolation between wire pairs is degraded communications reliability and increased error rates. Inadequate NEXT isolation is a symptom of a number of possible problems including incorrectly wired LAN connectors or telephone-grade cables that do not meet the specifications for data communications. The disadvantage of an instrument providing only a NEXT reading is that the instrument may not provide any additional information regarding the source of the problem, leaving the operator to troubleshoot the problem.

Accordingly, an instrument that can provide troubleshooting and verification of the proper connection of a variety LAN cable systems with a more complete set of automated diagnostic tests without the necessity of applying a cable identifier at the far-end of the LAN cable would be desirable.

SUMMARY OF THE INVENTION

In accordance with the present invention, an instrument for troubleshooting and verifying copper-wire LAN cables by measuring the resistance and capacitance between all possible combinations of wires and employing a software method of analyzing the measurements is provided. The LAN cable system to be tested consists of the LAN cable plus the connectors on either end. The near-end of the LAN cable system is coupled to one of several industry-standard connectors on the instrument. A series of resistance measurements is made between all possible combinations of wire pairs in the cable which are selected using switch matrices coupled to a resistance measurement unit. The resistance measurement results are stored in digital memory in the form of a resistance The stored resistance matrix values are then evaluated using the instrument microprocessor to detect the presence of a remote cable identifier on the other end of the cable as well as any shorted connections. A remote cable identifier, designed to augment the resistance measurement functions of the instrument when conditions allow, contains a system of dimes and resistors with predetermined values corresponding to a unique cable identifier number. With the cable identifier coupled to the far-end of the LAN cable system, each wire pair may be tested for polarity reversal and far-end open-circuit errors, and the respective cable identifier number is determined for the purpose of identifying a particular LAN cable system. With no cable identifier attached to the far-end of the LAN cable system, the resistance measurement is used to check for short-circuit errors. Short-circuit errors are tested for by comparing the measured resistance values to a figure of merit for short-circuit errors based on a predetermined threshold value. Short-circuit errors result in measured resistance values less than the figure of merit and, once a short-circuit error has been detected, distance of the short-circuit error from the near-end of the cable can be calculated by dividing the measured resistance by the resistance per unit of distance expected for that type of cable. Decisions relating to short-circuit errors, open-circuit errors, and diode polarities are stored symbolically in memory in a matrix format for further comparison to predetermined patterns of the expected LAN cable system to detect crossed-pair and polarity reversal errors. Mismatches detected between the derived pattern of the symbolic matrix and the expected pattern will generate an error signal to the operator.

The instrument next performs a series of capacitance measurements between all possible combinations of wire pairs which are selected using switch matrices coupled to the same measurement unit which is now configured for capacitance measurements. The measurement data are stored in digital memory in the form of a capacitance matrix. The stored capacitance matrix values are then evaluated to determine which wire pairs are twisted together, based on the phenomenon that wire pairs twisted together have a significantly higher capacitance value than that of adjacent wires not twisted together. Furthermore, open-circuit errors at the near-end of the cable are tested for by comparing the measured capacitance values to a figure of merit for open circuits based on a predetermined fraction of the maximum measured capacitance value. Open-circuit errors result in measured capacitance values significantly less than other measured capacitance values. The decisions regarding open-circuit errors and wire pairing are stored symbolically in memory in a matrix format for further comparison to predetermined patterns of the expected LAN cable system to detect split-pair errors. Mismatches detected will generate an error signal to the operator.

Finally, a difference capacitance matrix is calculated based on the assigned wire pairs. The difference in capacitance between each wire of the pair to all other wires in the cable is calculated in order to determine a relative figure of merit for near-end cross talk (NEXT). NEXT is a measure of the relative voltage isolation between wire pairs in which a signal in one wire pair induces a voltage in another wire pair via capacitive coupling. If the capacitance values between each of the wires of the wire pair to another wire is perfectly balanced, the capacitance values will match and the respective entry in the capacitance difference matrix is zero. A low difference capacitance precisely correlates to a high degree of voltage isolation between the wire pair and the other wires because the differential voltages induced through capacitive coupling between the wire pair and the other wires will be zero. Conversely, a large difference capacitance value signifies an unacceptably low level of NEXT isolation. Possible causes of low NEXT isolation include split-pair wiring errors and open-circuit errors in the wire pair being tested that result in a difference in the electrical length of the wires.

Unlike a conventional NEXT measurement which directly measures the isolation between wire pairs by comparing analog signal levels at a predetermined high frequency, the instrument according to the present invention directly utilizes the capacitance measurements stored in the capacitance matrix to calculate a difference capacitance for each possible wire pair which are stored in a difference capacitance matrix. A predetermined figure of merit based on empirical measurements that correlate to a threshold level of acceptable NEXT isolation is used to compare against the values in the difference capacitance matrix. Any value in the difference capacitance matrix higher than the figure of merit is a fault which will generate an error signal.

One feature of the present invention is to provide a method and apparatus for troubleshooting and verification of copper-wire local area network (LAN) cable systems using a series of resistance and capacitance measurements and software for evaluating the measurements.

Another feature of the present invention is to provide an instrument for troubleshooting and verifying copper-wire LAN cable systems at the near-end with no need to connect a cable identifier to the far-end of the cable.

A further feature of the present invention is to provide a test for the near-end cross talk (NEXT) parameter using a technique of mathematically calculated difference capacitance.

An additional object of the present invention is to provide an instrument for troubleshooting and verifying copper-wire LAN cables which is readily adaptable to a wide variety of LAN cable types.

Other features, attainments, and advantages will become apparent to those skilled in the art upon a reading of the following description when taken in conjunction with the accompanying drawings.

BRIEF DESCRIPTION OF THE DRAWINGS

FIG. 7 is a diagram illustrating the matrix data structure format in which the resistance dam are stored;

FIG. 9 is a diagram illustrating the matrix data structure format in which the capacitance data are stored;

FIG. 11 is a diagram illustrating the matrix format showing how the capacitance difference matrix is calculated.

DETAILED DESCRIPTION OF THE INVENTION

Figure 1A:
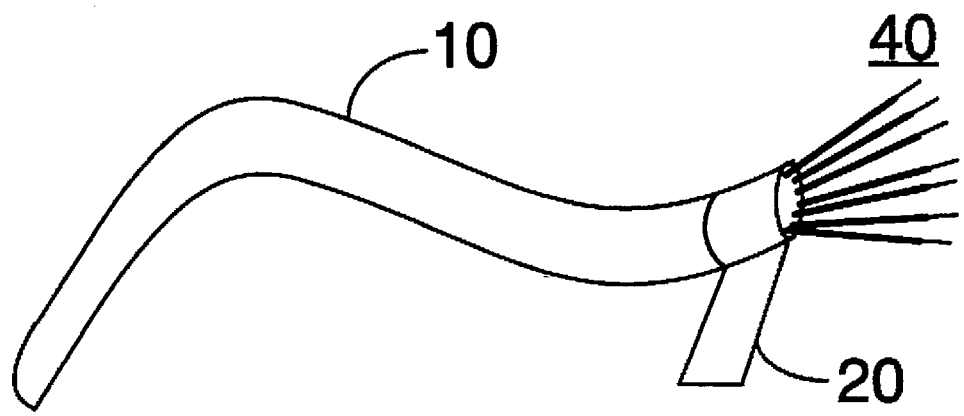
FIG. 1A and 1B are respectively is an illustration of a physical copper-conductor LAN cable and LAN cable connector.
Figure 1B:
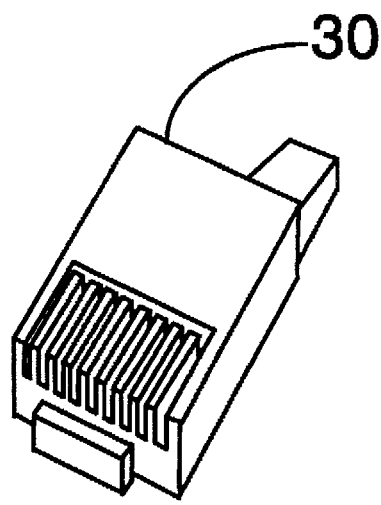

Referring to FIG. 1A and FIG. 1B, there is shown generally a LAN cable 10 which contains insulated copper-conductor wires 40 which commonly number between four and eight. The insulation on the wires is color-coded in order to facilitate proper connections of the cable to a connector 30. The wires are twisted together into wire pairs within a LAN cable to order to maximize the electrical isolation of each pair from the other pairs. The twist rate and other electrical and mechanical parameters are specified and well known in the industry for a data grade LAN cable. A LAN cable may be shielded, meaning that a shield 20 surrounds the wires of the cable as a conductive sheath to reduce susceptibility to external interference and also to reduce the electromagnetic emissions from the cable induced by the data transmission. The connector 30 is typically an eight-conductor telephone-type connector commonly referred to in the industry as an RJ-45 connector.

Figure 2:
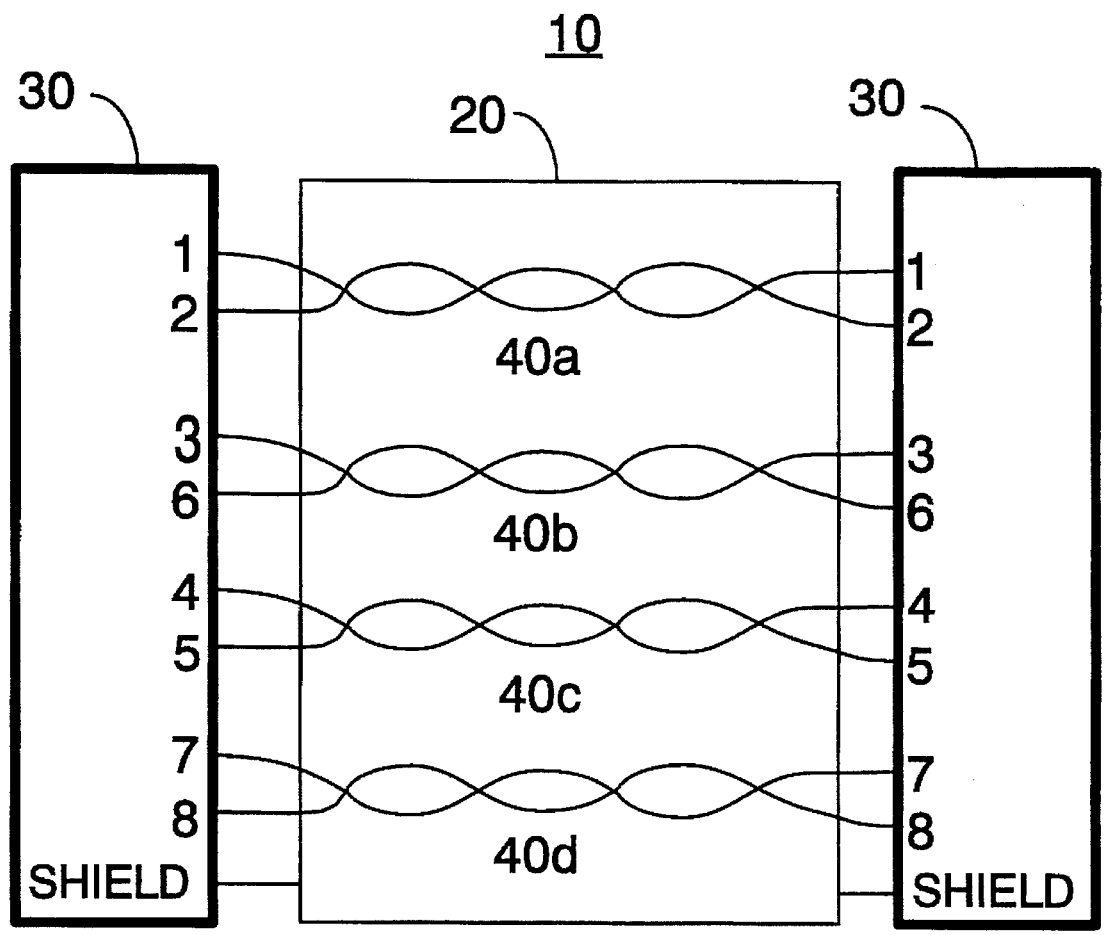
FIG. 2 is a circuit schematic of a LAN cable system consisting of a copper-conductor LAN cable and LAN cable connectors on either end showing the expected pairing of the wires.

Referring now to FIG. 2, the schematic diagram illustrates a complete and error flee LAN cable system consisting of the LAN cable 10 and connectors 30 on either end. The wires 40 are connected as shown in conformance with EIA/TIA-568. A twisted wire pair consists of two individual wires that are twisted together along the length of the cable to achieve electromagnetic isolation from other twisted wire pairs in the cable and from external sources of interference. A LAN cable 10 contains eight wires 40 typically formed as four twisted wire pairs. The shield 20, if present, is connected to the SHIELD connection of the connector 30 on either end of the LAN cable 10. When testing the LAN cable system, the end of the LAN cable 10 in which the LAN test instrument is connected is referred to as the "near-end" and the other end of the LAN cable 10 is the "far-end".

Figure 3:
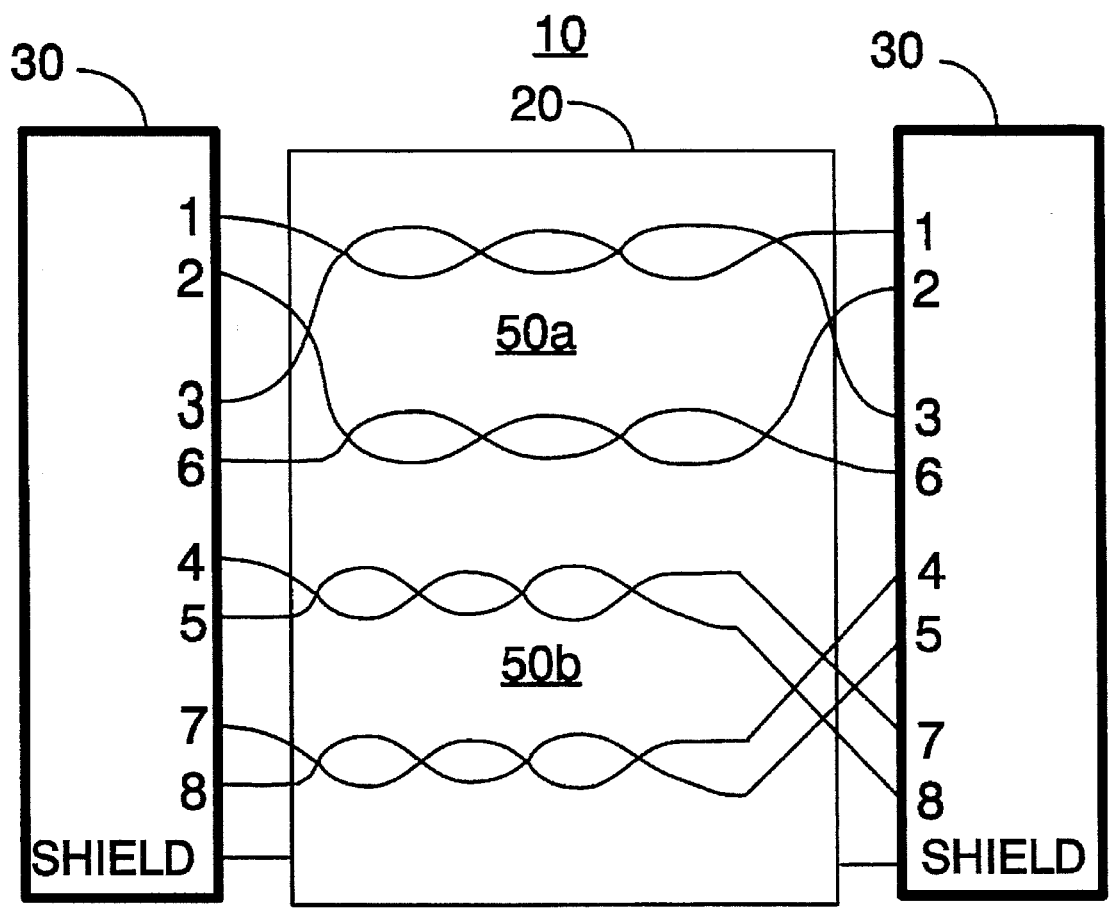
FIG. 3 is a circuit schematic of a LAN cable illustrating a split-pair wiring error and a crossed-pair wiring error.

FIG. 3 illustrates examples of several common wiring errors in a LAN cable system. Reversing the wires connected to connections 2 and 3 of the connector 30 on both ends of the cable creates a split-pair wiring error 50a which results in unacceptably poor isolation between the two data paths. Transposing two entire data paths, such as connections 4 and 5 for connections 7 and 8 on one end of the LAN cable 10 results in a crossed-pair wiring error 50b.

Figure 4:
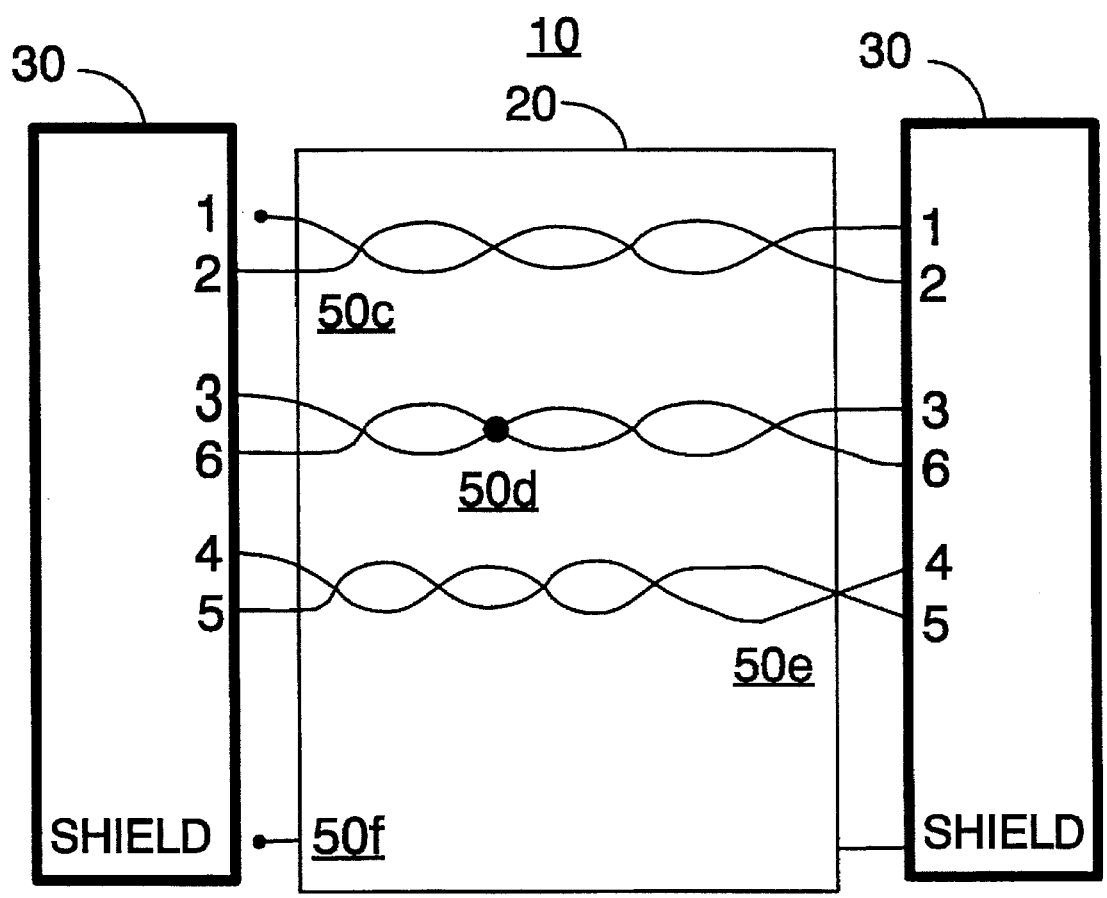
FIG. 4 is a circuit schematic of a LAN cable illustrating an open-circuit wiring error, a short-circuit wiring error, a polarity reversal wiring error, and an open-shield wiring error.

FIG. 4 further illustrates several more common wiring errors in a LAN cable system. An open circuit is a current path having a very high d.c. resistance, a condition normally expected between any pair of wires 40 of a LAN cable system with no terminations that provide current paths at the far-end. An open-circuit wiring error 50c can occur anywhere in the LAN cable system but is most commonly the result of failure of a wire 40 to make electrical contact at the connector 30. A short circuit is a current path having a relatively low d.c. resistance. A short-circuit wiring error 50d can occur between any two wires in the LAN cable system and may result from a defect in the wire insulation or as the result of the LAN cable 10 being physically crushed at some point along its length. Reversing the wires of a wire pair at one end of the LAN cable 10 results in a polarity-reversal error 50e. If the shield 20 is present, a failure to make electrical contact between the shield 20 and the SHIELD contact of connector 30 is an open-shield error 50f.

Figure 5:
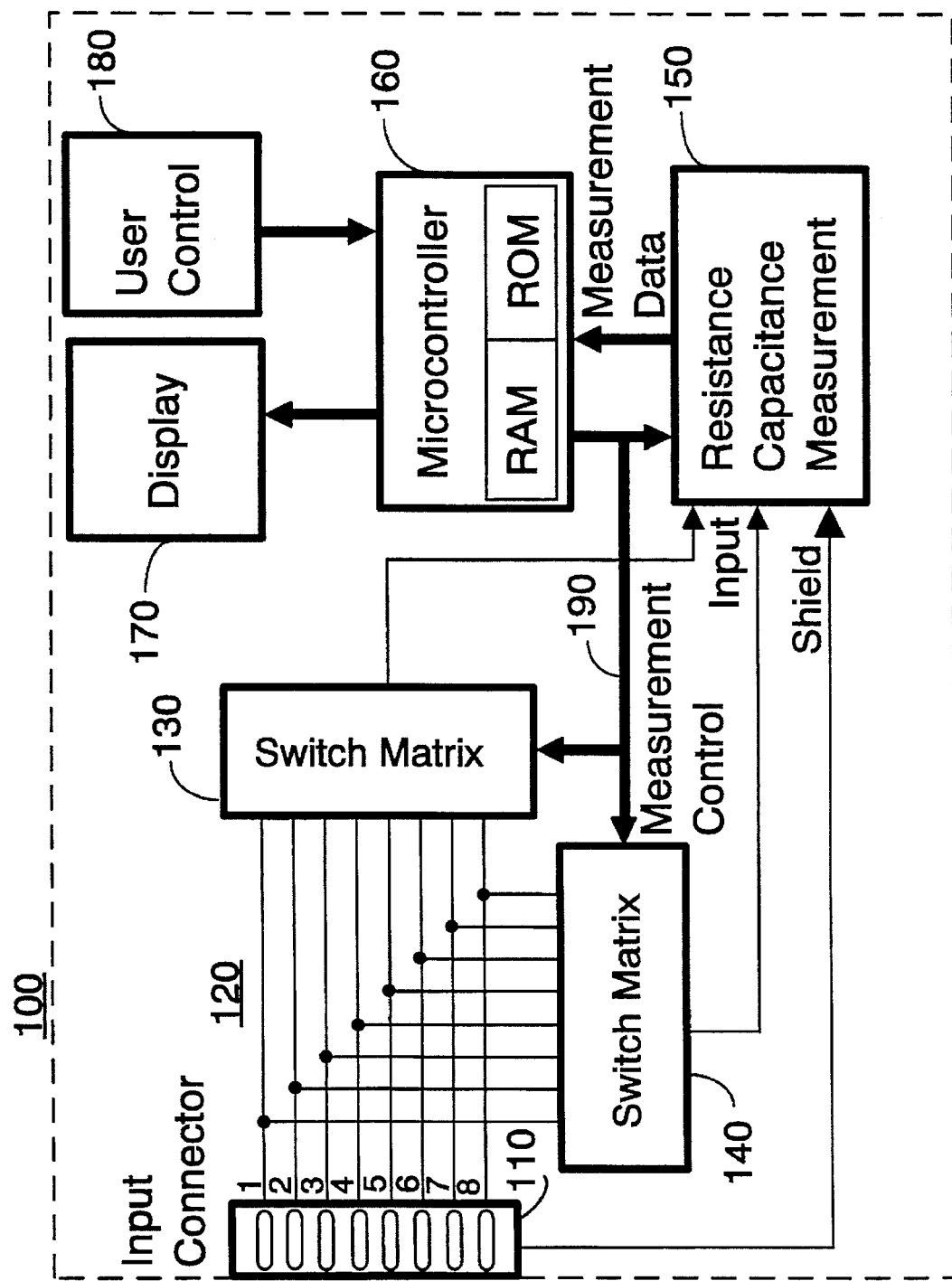
FIG. 5 is a block diagram of a LAN cable test instrument employing a method of resistance and capacitance measurement of all possible wire pairs.

Referring now to FIG. 5, there is shown the block diagram of a commercial embodiment of a LAN cable test instrument 100. An input connector 110 accepts the connector 30 which may connect to any of a variety of industry-standard connector types, including DB-9, RJ-45, and BNC in the commercial embodiment Each contact of a input connector 110 is coupled via a system of parallel input lines 120 which are numbered 1 through 8 to an input of a switch matrix 130 and a corresponding input of a switch matrix 140. The shield 20 of LAN cable 10 is coupled to a housing of the connector 110. Input connector 110 accepts up to eight input lines in the commercial embodiment but the architecture is readily extendible to include more lines. An output of the analog multiplexer 130 is coupled to an input of a measurement unit 150 and an output of the switch restrix 140 is coupled to a second input of the measurement unit 150. The housing of connector 110 is coupled to an input labeled Shield of measurement unit 150. Switch matrices 130 and 140 provide the measurement unit 150 with switching capability for the purpose of coupling the respective inputs of the measurement unit collectively labeled Input to any two of the input lines 120 for measuring electrical parameters at said Input which include the resistance through the selected wire pair and capacitance across the selected wire pair. The measurement data is coupled from the output of the measurement unit 150 to an input channel of the microcontroller 160.

The microcontroller 160 performs the functions of measurement control, measurement processing, and user interaction. In the commercial embodiment, microcontroller 160 is a microprocessor containing its own memory including RAM (random access memory) and ROM (read-only memory) in a single integrated circuit. The RAM is used for storing measurement data and test results while the ROM contains the system control instructions which are the software program executed by microcontroller 160 for controlling the overall operation of the instrument 100. It will be obvious that separate microprocessor, RAM, and ROM integrated circuits may also be effectively employed in place of the microcontroller 160. Microcontroller 160 is coupled to the measurement unit 150 and to the switch matrices 130 and 140 via the measurement control bus 190 to control the selection of wire pairs to be tested, along with the operation of the measurement unit 150. During the process of taking a measurement, microcontroller 160 controls the measurement unit 150 by selecting the measurement function, either resistance or capacitance, as well as providing a trigger signal to make the measurement and return the measurement data. Simultaneously, microcontroller 160 determines which of the input lines 120 are coupled to the measurement unit 150 by sending commands via measurement control bus 190 to the switch matrices 130 and 140. During the measurement process, the measurement values provided by the measurement unit 150 are stored in random access memory (RAM) in the microcontroller 160 in the conventional manner. For example, during a capacitance measurement between lines 1 and 2 of the input lines 120, the microcontroller 160 couples the input of the measurement unit 150 to lines 1 and 2 by sending the appropriate digital control signal to the analog multiplexers 130 and 140, sets the measurement unit 150 to capacitance mode, and obtains a capacitance measurement value which is stored symbolically in RAM as C12. Separate memory locations are maintained in RAM for storing capacitance and resistance measurement data.

The microcontroller 160 is coupled to peripheral devices to communicate with the user, displaying the instrument status and test results for the user on a display 170 and responding to user input via a user control interface 180. In the commercial embodiment, display 170 is a liquid crystal display (LCD) and the user control interface 180 is a keypad and rotary switch. The addition of other peripheral devices such as audio tone generators, external displays, and keyboards will be obvious.

Figure 6A:
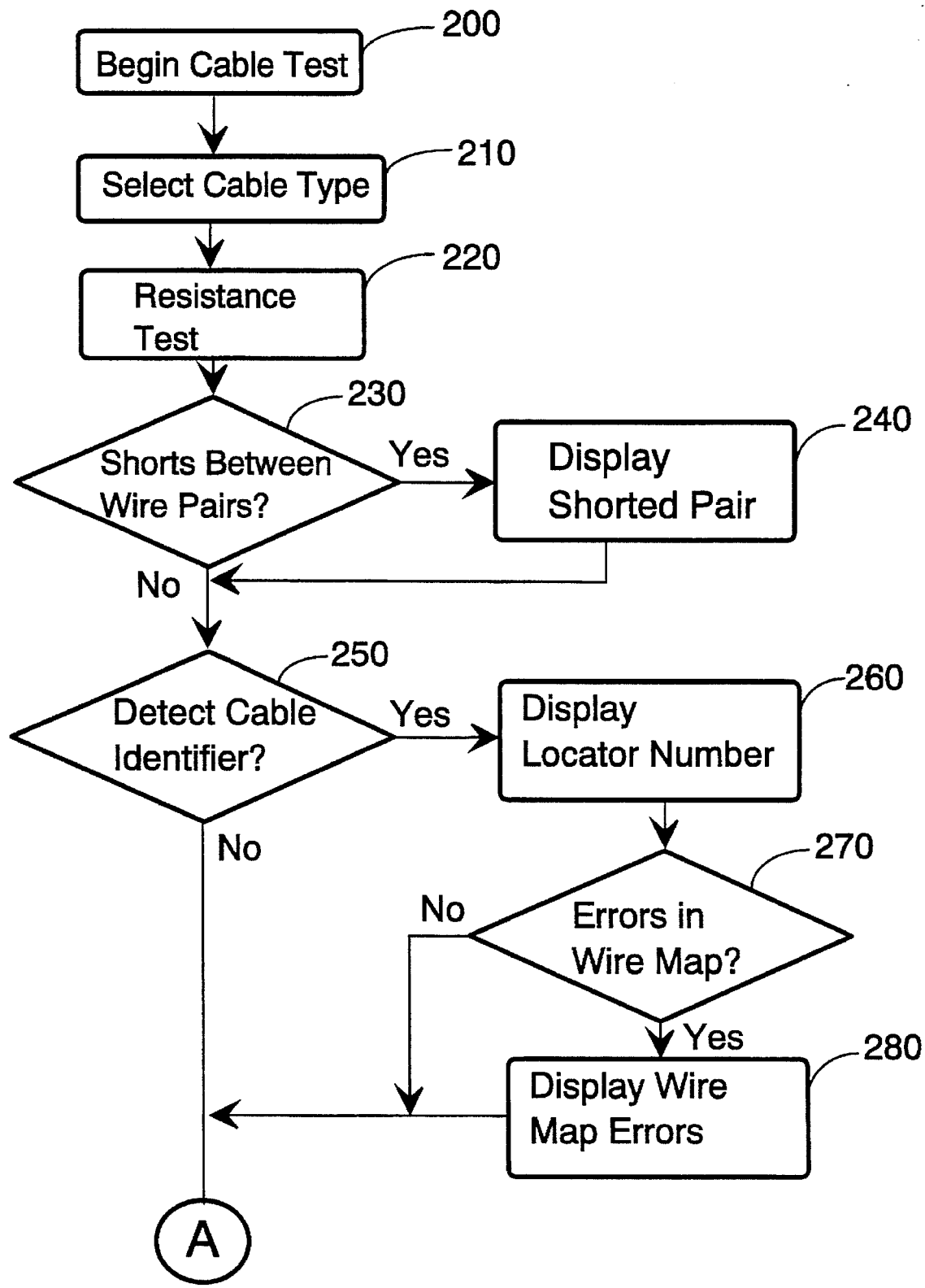
FIG. 6A–6C form a flow chart diagram illustrating the program executed by the microcontroller of the present invention.
Figure 6B:
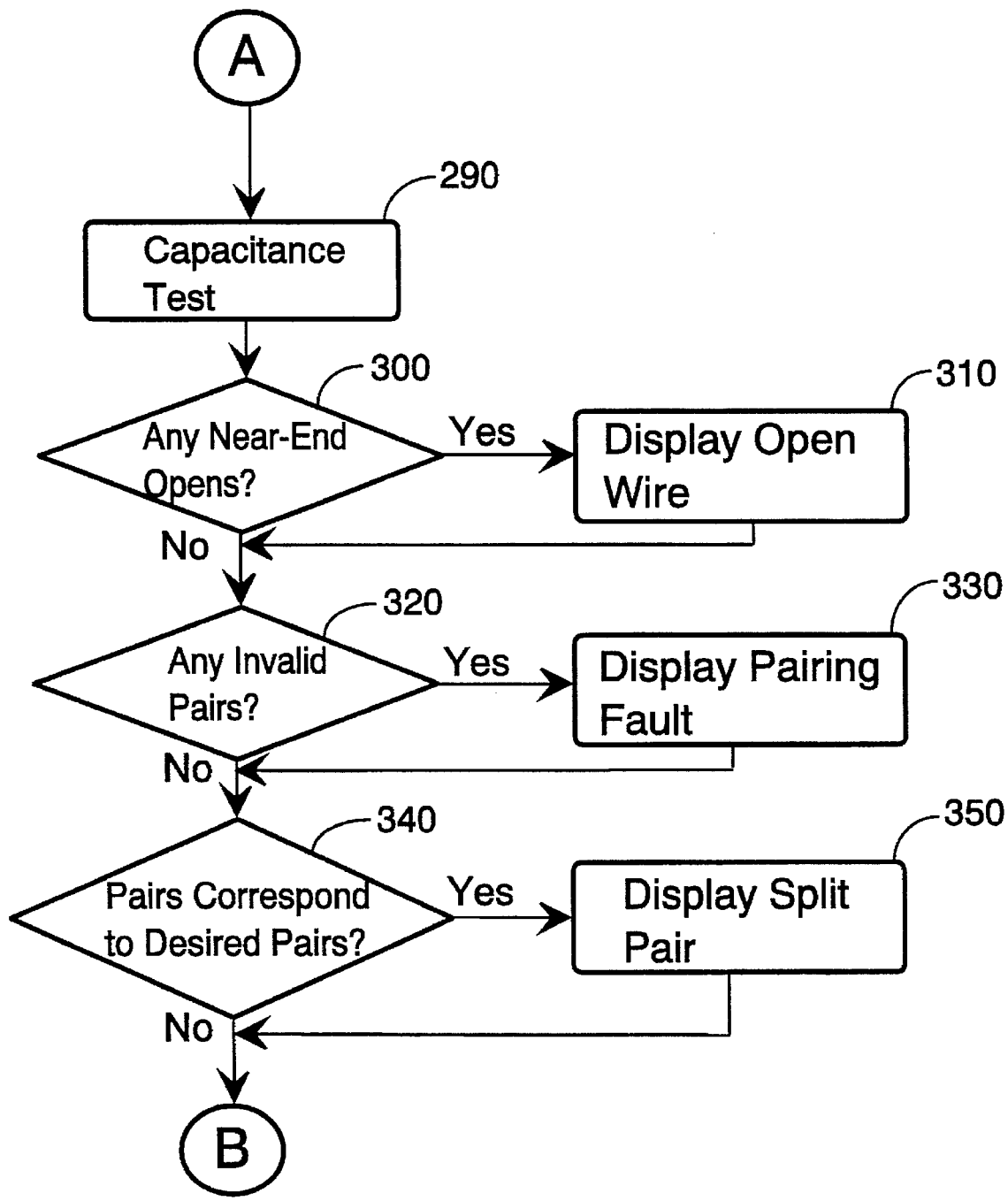
Figure 6C:
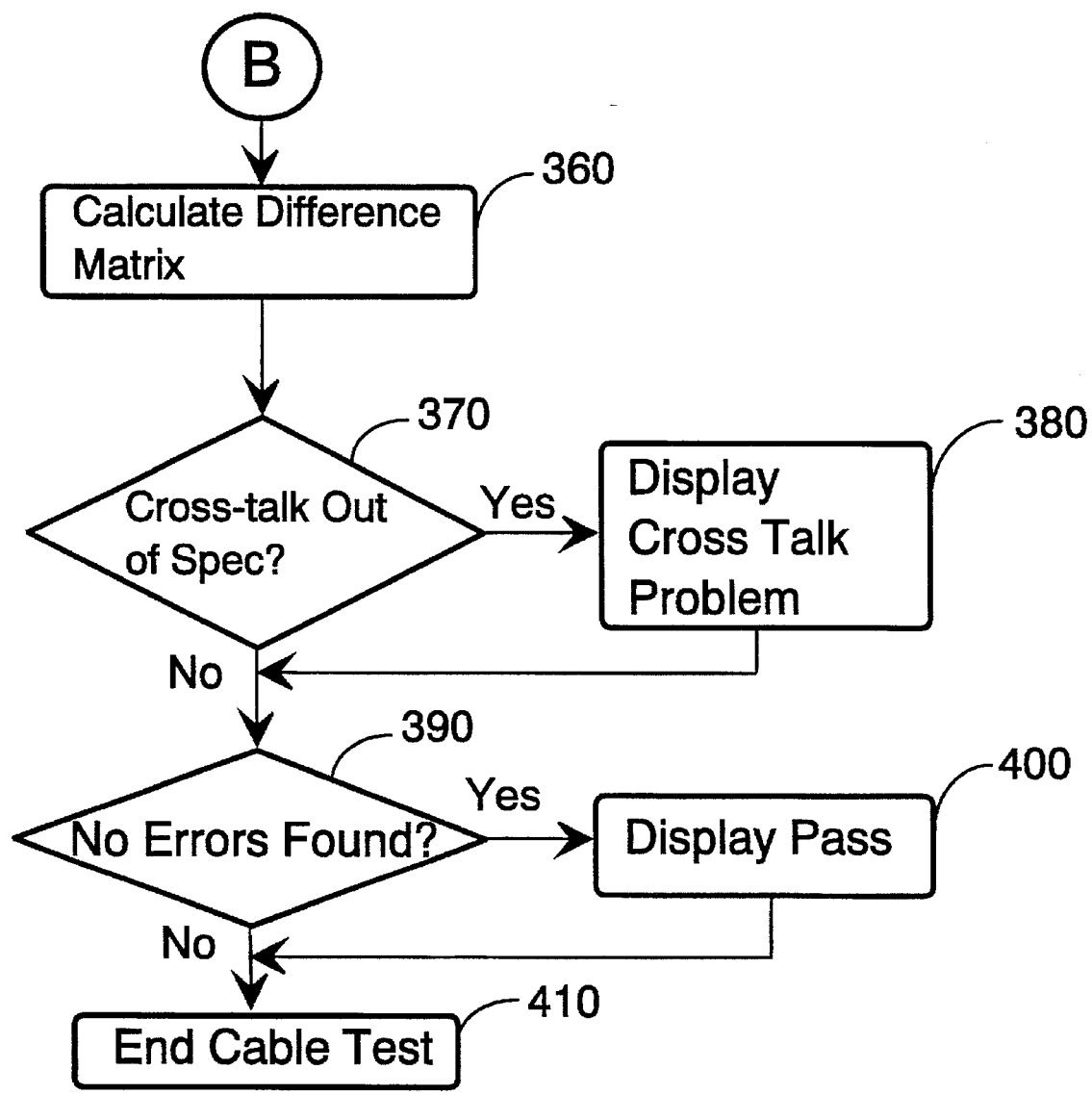

As an overview, FIG. 6A, 6B, and 6C together illustrate the process by which the measurements are taken and the data is processed in order to reach conclusions about whether the LAN cable system being tested is free of fault. The process is logically divided into three major sections. First, as shown in FIG. 6A, the resistance between all possible wire pairs is measured and evaluated for short-circuit wiring errors 50d. If a cable identifier is present, more detailed evaluations are performed. Second, as shown in FIG. 6B, the capacitance between all possible wire pairs is measured and evaluated for open-circuit wiring errors 50c, wire pairs are determined, and the pairings are evaluated against figures of merit. Third, as shown in FIG. 6C, the cross-talk isolation between all identified pairs of wires is evaluated using a calculated matrix of values based on the measured capacitance values.

Referring now to FIG. 6A, there is shown a flow chart illustrating the process by which the resistance measurements are performed. The test sequence begins with block 200. The test may be initiated by user control or on a continual basis with one test automatically following another.

The microcontroller 160 moves on to block 210 to read the type of LAN cable to be tested, such as unshielded twisted pair (UTP), shielded twisted pair (STP) or coax, the wire type, and cable configuration. An affirmative request of the user via control interface 180 such as through the selection of a menu displayed on display 170 can be used to change the type of LAN cable. This setting of LAN cable type primarily affects the type of tests that will be performed. The specification that follows is for UTP, the most commonly encountered cable type. If STP is selected, the instrument 100 will also check for an open-shield error in addition to the measurements performed for LrFP cable. If coax is selected, only one wire and the shield will be tested using a limited subset of measurements.

The measurement of resistance values between all pairs of wires is conducted in measurement block 220. Referring now to FIG. 7, the dam structure in which the resistance measurement dam are stored in digital memory is a resistance matrix 500. A total of 56 measurements are collected to fill out the matrix. The dots filling in the diagonal of the matrix, which are substituted in place of the diagonal values of R11, R22, R33, and so on, signify that these particular values are not valid because they do not involve measurements across a wire pair and are therefore ignored. The resistance measurement values are not symmetrical between the upper triangular values and lower triangular values. For example, R12 is not necessarily the same as R21 because the resistance measurement test which provides a d.c. test current has its polarity reversed between these measurements. If there is a diode junction in the current path, the junction will be forward biased in one direction and reverse biased in the other, resulting in a large difference in apparent resistance between the two polarities. This phenomenon is used to advantage when a cable identifier is connected to the far-end of the cable for the purpose of verifying the connections of the LAN cable system.

Referring back to FIG. 6A, the microcontroller 160 moves on to decision block 230. Each resistance measurement value is compared to a predetermined figure of merit for short-circuit errors with a value chosen to separate true short-circuit errors from otherwise normal resistance values, such as those presented by a cable identifier, with a minimum probability of false indications. If any resistance measurement value is less than the figure of merit for short-circuit errors, the microcontroller 160 branches to display block 240 in which the details of the short-circuit error found are provided to the user through the display 170.

The microcontroller 160 moves on to decision block 250 to detect the presence of the cable identifier at the far-end of the LAN cable system. If no cable identifier is detected, the resistance measurement test is limited to detecting short-circuit errors between wire pairs that should otherwise all be open circuits.

If coupled to the LAN cable system, the cable identifier provides the instrument 100 with predetermined resistance values in series with semiconductor diodes in each of the expected wire pairs of 1-2, 3-6, 4-5, and 7-8 in the commercial embodiment. The predetermined resistance value provides unique identification of the cable identifier number, with up to eight different cable identifiers available in the commercial embodiment. The microcontroller 160 compares each of the resistance measurement values to a series of figures of merit consisting of pairs of upper limit constants and a lower limit constants. The set of constants is based on the expected range of values of the provided cable identifiers and are carefully chosen so as to provide a highly certain determination of the presence of the cable identifier as well as its identifier number in spite of the contributions of the resistance of the intervening LAN cable system for cable lengths up to 1,000 feet. For example, if a measured resistance value is greater than lower limit value and less than upper limit value for cable identifier 1, the microcontroller 160 concludes that cable identifier 1 is present and the microcontroller 160 then branches to a series of steps based on the presence of the cable identifier, starting with display block 260.

In display block 260, the number of the cable identifier is displayed to the user using the display 170. Using the previous example, the presence of cable identifier 1 would thereby be indicated to the user. The microcontroller moves on to decision block 270 to check for errors in the wire map of the LAN cable system. A wire map is a complete characterization of the connections in the LAN cable system which is coupled between the instrument 100 and the cable identifier, utilizing the expected current directions dictated by the diode pairs in the cable identifier to check for all possible wiring errors and generate indicator values responsive to the directions. The wire map is checked by comparing the indicator values for each of the expected cable pairs to a corresponding expected indicator value. For example, the pair 1-2 is checked by comparing R12 and R21 to respective, pre-determined upper and lower limit values. Since the pair 1-2 has a diode and predetermined resistor value in series as provided by cable identifier, the values of R12 and R21 determine whether the pair is properly connected with the correct polarity. If wire map errors are detected, the microcontroller 160 branches to display block 280 to display the errors in the wire map to the user via display 170.

Figure 8:
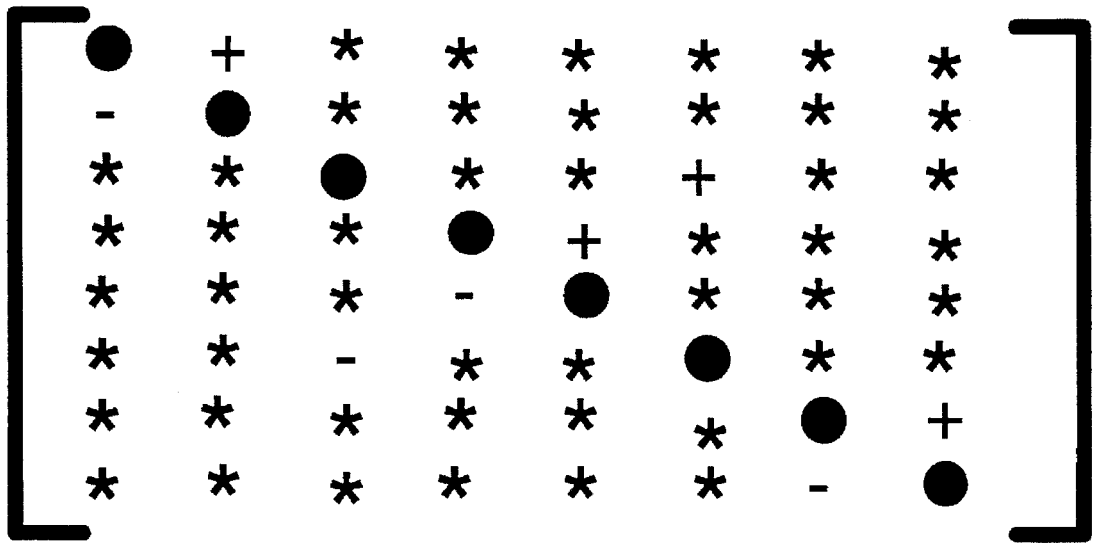
FIG. 8 is a diagram illustrating the treatment of the resistance measurement data into decision related information stored in a symbolic format.

Referring now to FIG. 8, a symbolic matrix 510 provides storage for the results of the decision process performed in blocks 230–280 operating on the resistance matrix 500. The resistance measurement values of resistance matrix 500 are first examined for short circuit wiring errors 50d between any two wires. Any measured resistance values that are below a predetermined figure of merit will be deemed to be a short-circuit and assigned an indicator value "0" in the respective position in the symbolic matrix 510. Next, the presence of diodes and open circuits is examined by comparing the measured resistance values of resistance matrix 500 to pre-determined figures of merit which are a series of pairs upper and lower resistance values which are based on expected resistances provided by one of a corresponding set of cable identifiers. If the resistance values are between the upper and lower limits, the respective position in the symbolic matrix 510 is assigned an indicator value "+" and the transverse matrix position is assigned an indicator value "−". If the measured value is above the highest upper resistance value expected for a cable identifier, the respective position in the symbolic matrix 510 is deemed to be an open circuit and assigned an indicator value "*". As shown in symbolic matrix 510 as an example, wire pairs 1-2, 3-6, 4-5 and 7-8 were found to have diodes in their respective paths with the polarities assigned to the respective directions through each wire pair and no short-circuit wiring errors 50d were found.

From this visual perspective of the collected indicator values provided by symbolic matrix 510, identifying errors in the wire map becomes a matter of comparison between the expected pattern developed for a known good LAN cable and the pattern identified. A LAN cable system with no cable identifier at the far-end should appear entirely as a pattern of open circuit "*" indicator values. A LAN cable system with a cable identifier connected at the far-end should appear primarily as a pattern of open-circuits but with "+" and "−" indicator values in the appropriate locations in the symbolic matrix. As different cable types become available, the figures of merit for comparing measurement values for detecting short-circuit errors, diode paths, and open-circuit errors may be modified and a new overall decision pattern of indicator values customized to match the new cable type by those having ordinary skill in the art.

Referring now to FIG. 9, the data structure in which the capacitance measurement values are stored is a capacitance matrix 520. A total of 28 measurements are collected to fill out the matrix. The dots that are along the diagonal of the matrix, which are substituted in place of the diagonal values of C11, C22, C33, etc. signify that these particular values are not valid because they do not involve measurements across a wire pair and are therefore ignored. The transverse matrix values of the capacitance matrix 520, such as C12 and C21, are equal because the capacitance measurement is an a.c. (alternating current) type measurement that does not have a single polarity.

Referring now to FIG. 6B, the measurement of capacitance values between all pairs of wires is conducted in measurement block 290. The microcontroller 160 then moves to block 300 to look for near-end open-circuit errors. Open wires at the near-end connection in the LAN cable system result in capacitance measurements that are significantly less than those of a properly connected wire pair. The maximum capacitance value is measured first and all the other capacitance values are compared with a predetermined fraction of that maximum value. If any of the other capacitance values are less than this predetermined fraction of the maximum value, they are deemed to be open circuits and generate a corresponding error. The predetermined fraction is a figure of merit that depends on the cable parameters and the maximum length of cable from the near-end in which an open-circuit error can be resolved. For example, in the commercial embodiment, capacitances less than 10% of the maximum value are deemed to be open-circuit wiring errors. If an open circuit is detected, the microcontroller 160 branches to the display block 310 to display the open circuit to the operator via display 170.

The microcontroller 160 then moves to decision block 340 to determine if the valid wire pairs found correspond to the expected pairings. In this case, wires 1-2, 3-6, 4-5, and 7-8 should be the identified valid pairs. If there is a problem detected in obtaining four valid pairs, the microcontroller 160 branches to display block 350 to display an error message to the operator via the display 170.

The microcontroller 160 then moves to decision block 320 to check for four valid wire pairs. Twisted wire pairs have higher mutual capacitance than wires in that same cable that are not twisted together. The four highest capacitance values among the measured data are selected and their validity as matched pairs is checked by comparing their values with the values of the other non-paired capacitance measurements. To be a valid matched pair, each ratio must exceed a predetermined figure of merit for the minimum ratio of paired capacitance to unpaired capacitance for all measurements. In the commercial embodiment of the present invention, a standard data grade LAN cable must have a minimum expected ratio of 2.0. Other figures of merit may readily be derived without undue experimentation by one skilled in the art. Ratios less than the figure of merit of 2.0 indicate any of a number or problems that might include a cable that is not adequate for data communications such as voice-grade telephone cable. If there is a problem detected in obtaining four valid pairs, the microcontroller 160 branches to display block 330 to display an error message to the operator via the display 170. Some types of LAN cables are twisted together in such a way that eight valid pairs are generated rather than four. In this special situation, no error is generated in decision block 320 for having too many matched pairs.

Figure 10:
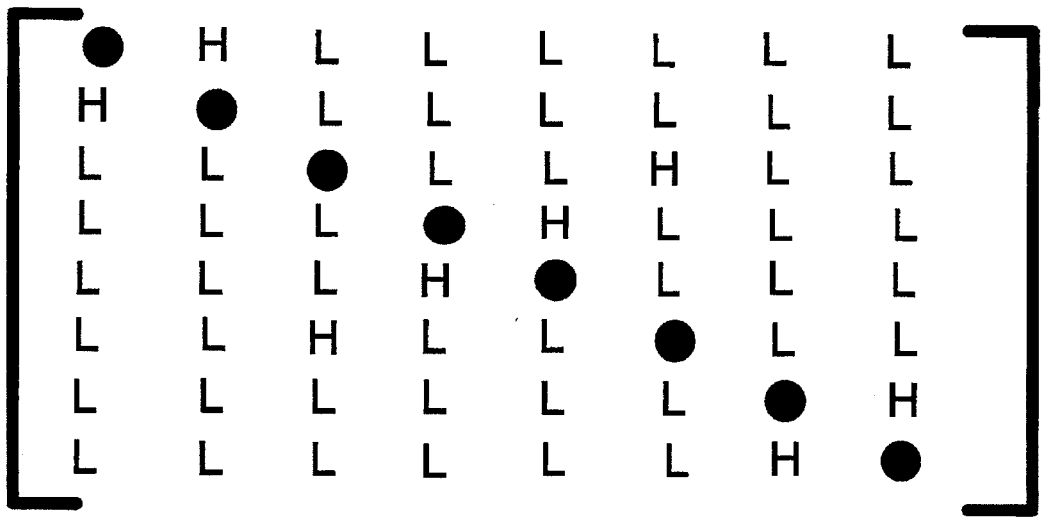
FIG. 10 is a diagram illustrating the treatment of the capacitance measurement data into decision related information stored in a symbolic format.

Referring now to FIG. 10, a symbolic matrix 530 provides storage for the results of the decision process performed in blocks 290–350 operating on the capacitance matrix 520. The capacitance measurement values of capacitance matrix 520 are first examined for near-end open-circuit wiring errors 50c between any two wires. Any measured capacitance values that are below a predetermined figure of merit will be deemed to be an open-circuit wiring error and assigned an indicator value of "*" which is stored in the respective position in the symbolic matrix 530. The higher value capacitances associated with twisted-wire pairs are determined as against the capacitances of wires not twisted together. The twisted-wire pairs are assigned an indicator value "H" in the symbolic matrix and the other wires are assigned an indicator value "L". As shown as an example test result in the symbolic matrix 530, wire pairs 1-2, 3-6, 4-5 and 7-8 were found to be twisted-wire pairs and no open-circuit errors were identified.

From this visual perspective provided by symbolic matrix 530, identifying errors in the pairing of wires becomes a matter of comparison between the expected pattern of indicator values developed for a known good LAN cable and the pattern of indicator values found. The indicator value pattern is unaffected by the presence or absence of the cable identifier connected at the far-end of the cable. As different cable types become available, the figures of merit for detecting open-circuit errors and twisted-wire pairings may be modified and overall decision pattern customized to match the new cable type by those having ordinary skill in the art.

Referring now to FIG. 11, the microcontroller 160 calculates a capacitive difference matrix 540 based on the data from the capacitance matrix 520. Each entry in the capacitive difference matrix is the difference between the capacitance measured from each wire of the respective pair to a third wire. The NEXT isolation of wire pair 1-2 is evaluated in the first row of the difference capacitance matrix 540. The first two entries, which would be C11-C21 and C12-C22 respectively, are meaningless values because they each involve the diagonal values C11 and C22 which are meaningless values from the original capacitance matrix 520 and are thus substituted with dots and subsequently ignored. The third entry in the top row of difference capacitance matrix 540 is C13-C23 which is the figure of merit for the isolation between wire pair 1-2 and wire 3. Similarly, the fourth entry in the top row of difference capacitance matrix 540 is C14-C24 which is the figure of merit for the isolation between pair 1-2 and wire 4. The other entries in the capacitance difference matrix 540 are developed in a like manner for the assigned wire pairs 3-6, 4-5, and 7-8 which make up the second, third, and fourth rows respectively. The values of the capacitive difference matrix 540 are used to verify near-end cross talk (NEXT) isolation between the identified wire pairs and all the other wires in the LAN cable by comparing each value to a figure of merit correlated to a threshold acceptable level of NEXT isolation and generating an error signal in response to values that exceed the figure of merit.

Figure 12:
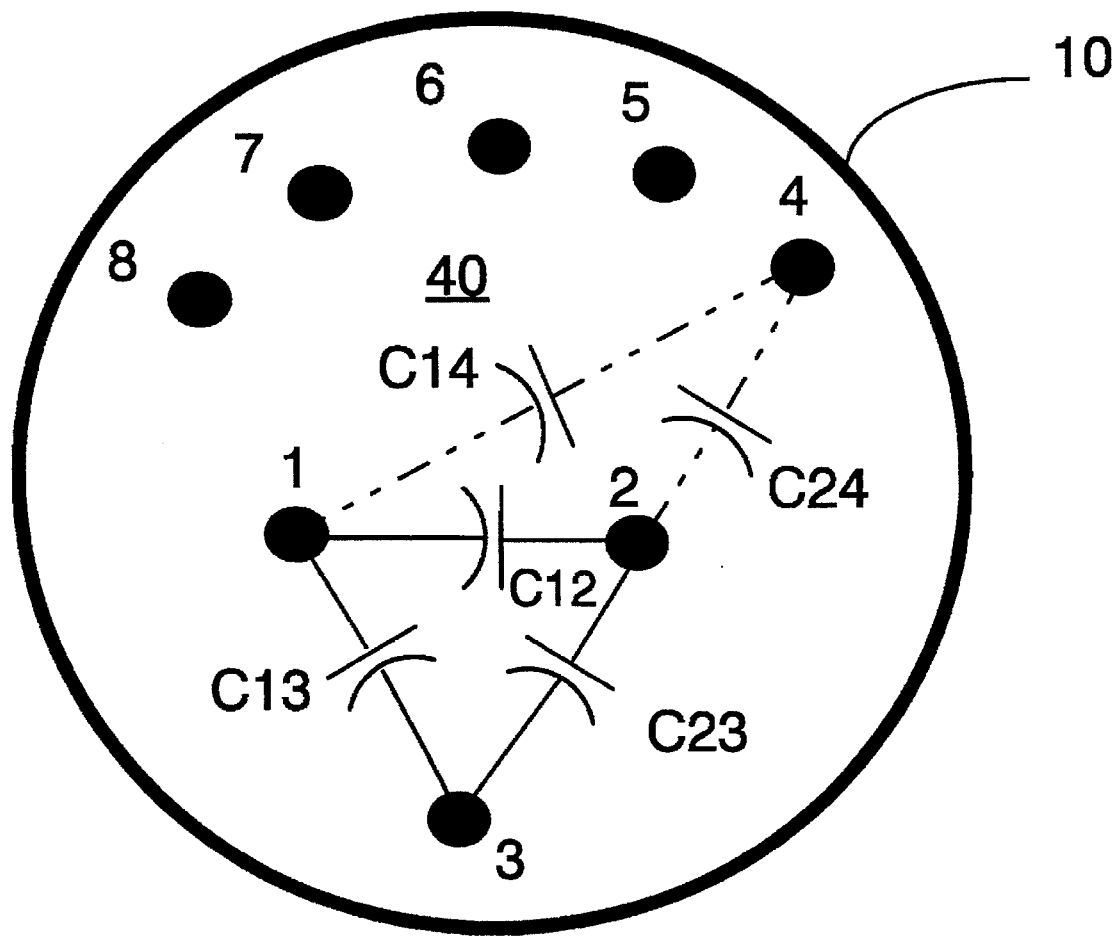
FIG. 12 is an illustration of the physical end view of an 8-wire LAN cable which illustrates the relationship of the physical capacitance elements between the wires calculated in the capacitance difference matrix.

Referring now to FIG. 12, the physical significance of capacitance difference for each entry is illustrated in a cross-section view of the LAN cable 10 containing the wires 40. As shown, the wire pair 1-2 is evaluated for the difference in capacitance measured to a third wire 3 which is expressed as C13-C23 corresponding to the appropriate entry in the difference capacitance matrix. Similar, the difference calculation between pair 1-2 and wire 4 is illustrated as shown with the capacitances connected with dashed lines. The other entries in the capacitance difference matrix 540 are calculated in a like manner. The value of the capacitive difference correlates to NEXT values measured through prior art analog techniques which measure the signal isolation directly by inducing a voltage in the wire pair and measuring the ratio of induced signal to applied signal. If the capacitive difference is relatively low, any voltage induced across C12 in the wire pair 1-2 by wire 3 will be equal and therefore no differential voltage will be capacitively induced across the wire pair from voltages present in wire 3. However, if the difference capacitance is significantly large, the NEXT isolation of the wire pair 1-2 to wire 3 deteriorates proportionately. Accordingly, a figure of merit for maximum differential capacitance was derived that correlates to an acceptable level of NEXT isolation which in turn is determined by industry specifications.

Referring now to FIG. 6C, the microcontroller 160 moves to decision block 360 to calculate the capacitance difference matrix 540 as discussed above. The microcontroller 160 then moves on to decision block 370 to perform the NEXT isolation check in which each entry in the capacitance difference matrix 540 is compared with the figure of merit for NEXT isolation and, if any entry exceeds that figure of merit, the microcontroller 160 branches to a display block 380 to display the detected NEXT problem to the operator via the display 170.

The microcontroller 160 moves to decision block 390 to determine whether any prior errors have been encountered during the entire test phase. If no errors have been detected, microcontroller 160 branches to display block 400 to alert the operator that no errors have been found. The test sequence as illustrated in FIG. 6A, 6B, and 6C then terminates in block 410.

It has been shown herein a method for testing LAN cables. A series of resistance measurements is made between all possible wire pairs and stored in a resistance matrix where decisions are made regarding short-circuit errors, and, If the cable identifier is present, diode polarities and cable identifier numbers by comparing the resistance measurement values to a predetermined set of figures of merit. The individual decisions are stored symbolically in a symbolic matrix as indicator values and the pattern of indicator values is compared to a known good pattern. A series of capacitance measurements is then made between all possible wire pairs and stored in a capacitance matrix where decisions are made regarding open-circuit errors and wire pairings by comparing the capacitance measurement values to a predetermined set of figures of merit. The individual decisions are stored symbolically in another symbolic matrix and the pattern of symbols is compared to a known good pattern. Finally, the near-end cross talk isolation between identified cable pairs is evaluated by calculating a difference capacitance from the values stored in the capacitance matrix and the resulting difference capacitance values are compared to a predetermined figure of merit correlated to an acceptable threshold level of NEXT isolation.

It will be obvious to those having ordinary skill in the art that many changes may be made in the details of the above described preferred embodiments of the invention without departing from the spirit of the invention in its broader aspects. For example, different types of switches may be substituted for the switch matrices 130 and 140. Different user interface technologies may be substituted for display 170 and user control 180. The methods of evaluating the resistance and capacitance measurements may be readily tailored and the sequence of programmed tests readily altered to adapt to new types of LAN cable configurations and systems as they arise. Therefore, the scope of the present invention should be determined by the following claims.

What we claim as our invention is:

1. In a LAN cable test instrument, a method for determining a set of twisted-wire pairs within a LAN cable containing a plurality of wires, comprising:

(a) measuring capacitance between each pair of said wires within said LAN cable to produce a set of capacitance measurement values;

(b) selecting a subset of said set of capacitance measurement values which are substantially higher than all remaining capacitance measurement values;

(c) comparing each of said capacitance measurement values in said subset with each of said remaining capacitance measurement values in said set to determine a minimum ratio of paired capacitance to unpaired capacitance wherein an error signal is generated if said minimum ratio is less than a predetermined figure of merit; and (d) displaying said twisted-wire pairs according to said subset.

2. A method for determining a set of twisted-wire pairs within a LAN cable containing a plurality of wires according to claim 1 further comprising storing each of said capacitance measurement values in a memory means as a capacitance matrix.

3. A method for determining a set of twisted-wire pairs within a LAN cable containing a plurality of wires according to claim 2 further comprising generating a symbolic matrix containing indicator values according to said subset.

4. A method for determining a set of twisted-wire pairs within a LAN cable containing a plurality of wires according to claim 3 further comprising:

(a) comparing a pattern formed by said symbolic matrix to an expected pattern of indicator values for a known good LAN cable; and (b) generating said error signal if said pattern does not match said expected pattern.

5. A method for determining a set of twisted-wire pairs within a LAN cable containing a plurality of wires according to claim 1 further comprising:

(a) comparing each of said capacitance measurement values against a predetermined figure of merit for open circuits; and (b) generating said error signal if any of said capacitance measurement values are less than said predetermined figure of merit for open circuits.

6. In a LAN cable test instrument, a method for evaluating near-end cross-talk between first and second twisted-wire pairs in a LAN cable, comprising:

(a) measuring capacitances between a first wire of said first twisted-wire pair and one wire of said second twisted-wire pair and between a second wire of said first twisted-wire pair and one wire of said second twisted-wire pair within said LAN cable to produce first and second capacitance measurement values;

(b) measuring capacitances between a first wire of said first twisted-wire pair and another wire of said second twisted-wire pair and between a second wire of said first twisted-wire pair and another wire of said second twisted-wire pair within said LAN cable to produce third and fourth capacitance measurement values;

(c) calculating a first capacitance difference value between said first and second measurement values;

(d) calculating a second capacitance difference value between said third and fourth measurement values;

(e) comparing said first and second capacitance difference values to a predetermined figure of merit correlated to an acceptable level of near-end cross-talk; and (f) generating an error signal if at least one of said first and said second capacitance difference values exceeds said predetermined figure of merit.

7. A method for evaluating near-end cross-talk between first and second twisted-wire pairs in a LAN cable according to claim 6 further comprising generating a capacitance difference matrix from said first and second capacitance difference values.

8. In a LAN cable test instrument according to claim 6 further comprising visually displaying said error signal.

9. In a LAN cable test instrument, a method for evaluating near-end cross-talk between a twisted-wire pair and a conductor in a LAN cable, comprising:

(a) measuring capacitances between a first wire of said first twisted-wire pair and said conductor and between a second wire of said first twisted-wire pair and said conductor to produce first and second capacitance measurement values;

(b) calculating a capacitance difference value between said first and second measurement values;

(c) comparing said capacitance difference value to a predetermined figure of merit correlated to an acceptable level of near-end cross-talk; and (f) generating an error signal if said capacitance difference value exceeds said predetermined figure of merit.

10. In a LAN cable test instrument according to claim 9 further comprising visually displaying said error signal.

* * * * *